United States Patent [19]
Khatibzadeh

[11] Patent Number: 5,528,189
[45] Date of Patent: Jun. 18, 1996

[54] NOISE PERFORMANCE OF AMPLIFIERS

[75] Inventor: M. Ali Khatibzadeh, Plano, Tex.

[73] Assignee: Texas Instruments Incorporated, Dallas, Tex.

[21] Appl. No.: 171,138

[22] Filed: Dec. 21, 1993

[51] Int. Cl.⁶ .............. H03F 1/32; H03K 17/60
[52] U.S. Cl. .......... 327/314; 327/324; 327/375; 327/584; 257/577
[58] Field of Search .............. 307/318, 317.1, 307/303, 322, 542, 544, 566, 567; 257/577, 197, 198; 327/188, 194, 195, 196, 309, 310, 313, 314, 324, 327, 375, 574, 579, 580, 583, 584

[56] References Cited

U.S. PATENT DOCUMENTS

| | | | |
|---|---|---|---|
| 3,047,729 | 7/1962 | Peterson | 307/318 |
| 3,268,822 | 8/1966 | Hickey | 307/302 |
| 3,398,381 | 8/1968 | Torick | 307/566 |
| 3,641,407 | 2/1972 | Scott | 307/566 |
| 3,980,963 | 9/1976 | Doi | 327/513 |
| 4,119,869 | 10/1978 | Hashimoto | 307/317.1 |
| 4,223,238 | 9/1980 | Parkinson | 307/566 |
| 4,251,742 | 2/1981 | Beelitz | 307/320 |
| 4,322,634 | 3/1982 | Kaire et al. | 307/544 |
| 4,639,823 | 1/1987 | Kuroki | 327/380 |
| 4,897,564 | 1/1990 | Chen | 307/542 |
| 5,166,083 | 11/1992 | Bayrakutaroglu | 257/197 |
| 5,202,619 | 4/1993 | Furuhata | 327/579 |
| 5,298,788 | 3/1994 | Moreau | 257/577 |

FOREIGN PATENT DOCUMENTS

| | | | |
|---|---|---|---|
| 0013107 | 1/1987 | Japan | 330/296 |

Primary Examiner—Timothy P. Callahan
Assistant Examiner—T. Lam
Attorney, Agent, or Firm—Michael K. Skrehot; James C. Kesterson; Richard L. Donaldson

[57] ABSTRACT

In one form of the invention, a circuit is disclosed, the circuit comprising: a transistor Q having an input terminal 14 with an avalanche breakdown voltage to electrical ground; and one or more diodes 16 arranged in a series between the input terminal 14 and electrical ground, the diode series 16 having a forward-biased voltage drop that is smaller than the avalanche breakdown voltage.

7 Claims, 6 Drawing Sheets

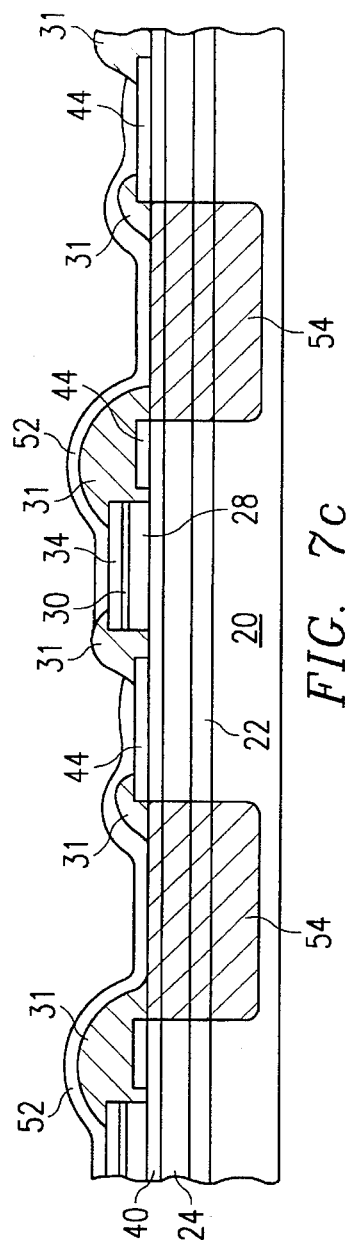
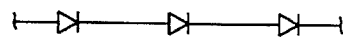
FIG. 7b
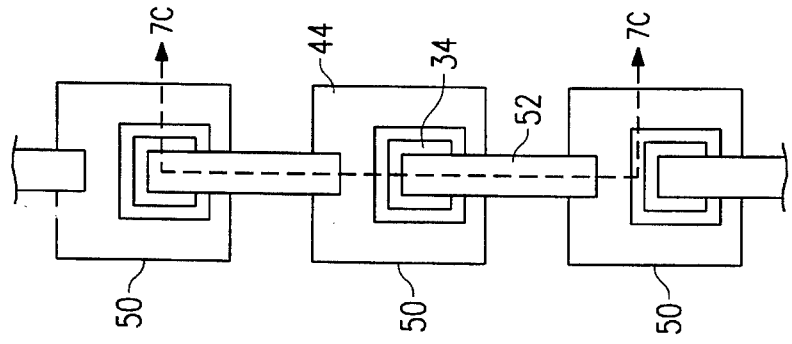

NOISE PERFORMANCE OF AMPLIFIERS

FIELD OF THE INVENTION

This invention generally relates to circuits and methods for improving the noise characteristics of amplifiers.

BACKGROUND OF THE INVENTION

High-efficiency (>50%, for example) RF or microwave power amplifiers are typically designed to operate in Class-B, Class-C, Class-E or Class-F modes. A common characteristic of these modes of operation is that in the absence of an input microwave signal, the solid state active transistor of the power stage(s) is biased at or near zero quiescent current. As the amplifier is driven by external microwave power, the operating current of the transistor rises to the designed level, thereby amplifying the microwave signal. FIG. 1 shows the typical variation of the operating current of a bipolar transistor biased for a high efficiency mode of operation.

A problem with such modes of operation is that the input junction of the device can be driven into reverse (avalanche) breakdown under large signal conditions. When a charge carrier travels in a semiconductor medium, it travels, on average, a "mean free path" before interacting with an atom in the lattice and losing its energy. In an npn bipolar transistor, as the base-emitter bias is increased to a large negative value, the electric field in the junction becomes large. Consequently, a charge carrier can gain sufficient energy from the field while traveling within its mean free path to free a bound electron upon impacting the lattice. The initial carrier and the free hole and electron created by the collision are then free to leave the region of the collision. This process is called impact ionization. When the base-emitter bias reaches a critical negative value, $-V_{BE(BD)}$ (the base-emitter junction breakdown voltage), the events of impact ionization are so numerous that the base current due to the ionized carrier becomes very large and the transistor ceases to function properly. A transistor in this condition is said to be in avalanche breakdown. The avalanche breakdown of semiconductor-semiconductor, metal-semiconductor, or metal-insulator-semiconductor junctions generates an excessive amount of white noise. An amplifier suffering from such noise is unacceptable for applications such as the transmitters and receivers commonly used in telecommunications devices. Evidence of the level of this noise can be taken from the fact that avalanche diodes are used as noise sources in instrumentation.

SUMMARY OF THE INVENTION

In one form of the invention, a circuit is disclosed, the circuit comprising: a transistor having an input terminal with an avalanche breakdown voltage to electrical ground; and one or more diodes arranged in a series between the input terminal and electrical ground, the diode series having a forward-biased voltage drop that is smaller than the avalanche breakdown voltage.

In another form of the invention, an integrated circuit is disclosed, the integrated circuit comprising a transistor and one or more diodes, the transistor and diodes sharing a material structure which includes a base layer adjacent to and lying beneath an emitter layer; wherein an emitter mesa of the transistor and one or more cathode mesas of the diode comprise the emitter layer; wherein the circuit includes a base contact and one or more anode contacts on the base layer; and wherein one of the cathode mesas is electrically coupled to the base contact and one of the anode contacts is electrically coupled to electrical ground.

In still another form of the invention, a method is disclosed for improving the noise performance of a transistor, the method comprising arranging one or more diodes in series between an input terminal of the transistor and an electrical ground, wherein the diodes enter reverse breakdown at a voltage smaller than a reverse breakdown voltage of the transistor.

An advantage of the invention is that the diodes clamp the base-emitter junction of the transistor to a voltage lower than its reverse breakdown voltage. This inhibits the transistor from producing the noise associated with avalanching, which in turn allows for amplifier designs with enhanced noise performance. The invention also improves transistor reliability by minimizing the physically damaging effects of the catastrophic avalanche event. Finally, heterojunction bipolar transistors have traditionally been more susceptible to electrostatic discharge damage from negative voltage spikes. The invention described herein limits damage to the base-emitter junction of a transistor from these large negative voltages.

BRIEF DESCRIPTION OF THE DRAWINGS

In the drawings:

FIG. 2b is a graph of the dynamic load line of the transistor of FIG. 2a;

FIG. 2c is a graph of the forward and reverse bias current-voltage characteristics of the transistor of FIG. 2a;

FIG. 7a is a plan view of a portion of a diode string layout;

FIG. 7b is a schematic representation of the layout of FIG. 7a;

FIG. 7c is a cross-sectional diagram of a the diode string of FIG. 7a; and

Corresponding numerals and symbols in the different figures refer to corresponding parts unless otherwise indicated.

DETAILED DESCRIPTION OF PREFERRED EMBODIMENTS

Figure 1:
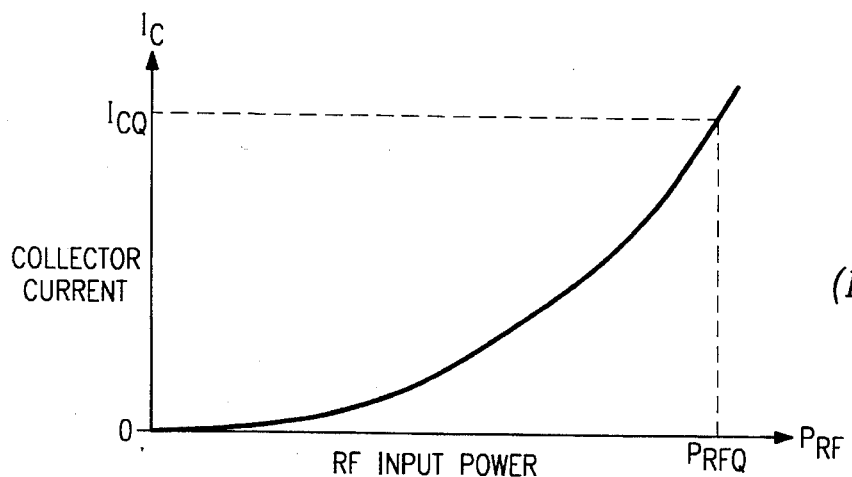
FIG. 1 is a graph of collector current vs. microwave input power for a typical high efficiency power amplifier.
Figure 2A:
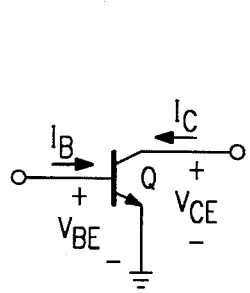
FIG. 2a is a schematic diagram of a transistor amplifier showing current and voltage polarity conventions.
Figure 2C:
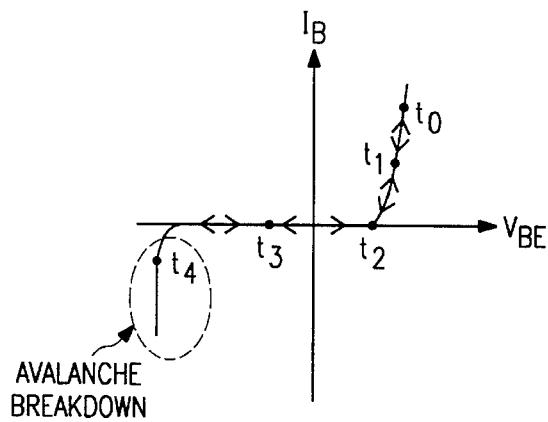
Figure 2B:
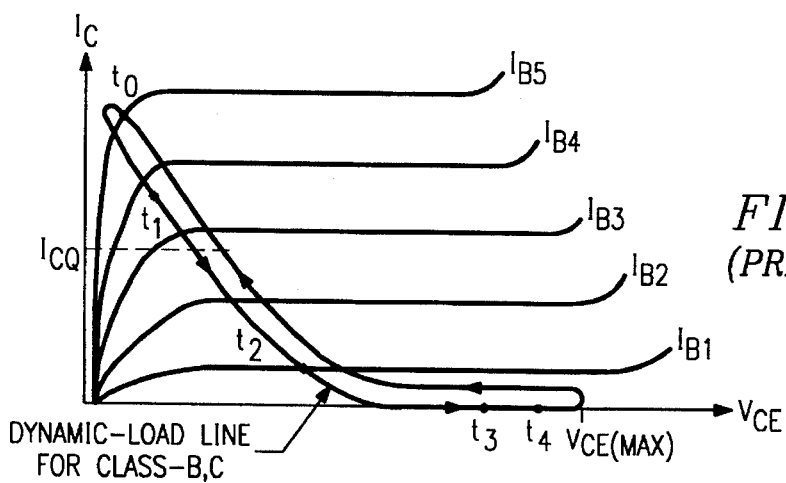

FIGS. 2b and 2c are illustrations of the current-voltage characteristics of a bipolar transistor over the positive and negative excursions of a single cycle of a sinusoidal microwave signal at the transistor's base input terminal. As shown in FIG. 2a, the bipolar transistor is in a common-emitter configuration. FIG. 2b shows the dynamic-load line for class-B and class-C operation of transistor Q in relation to the collector-emitter voltage ($V_{CE}$), the collector current ($I_C$), and the base current ($I_B$). As the transistor is driven under a large-amplitude microwave signal, the base-emitter voltage is driven to large negative values near avalanche breakdown ($t_4$ in FIG. 2c). At instant $t_4$, an enormous amount of white noise is generated. When the junction is forward biased (at instants $t_1$ and $t_0$), shot noise is generated, but it is several orders of magnitude smaller than that generated in the avalanche breakdown condition.

For an amplifier to generate large amounts of output power, it is necessary to bias and operate the transistor such that it comes very close to breakdown under normal conditions. Hence, it is likely that under large signal conditions the transistor will be driven into breakdown and generate a large amount of noise. However, the invention described herein presents a solution to this problem by limiting the voltage across the transistor's base-emitter junction. The base-emitter voltage is "clamped" in a way that generates orders of magnitude less noise than does the avalanche breakdown of the input (base-emitter) junction of the transistor. An amplifier fabricated with this less-noisy configuration offers the transmitter or receiver designer improved noise performance with little or no impact on the amplifier's gain or power characteristics.

Figure 3:
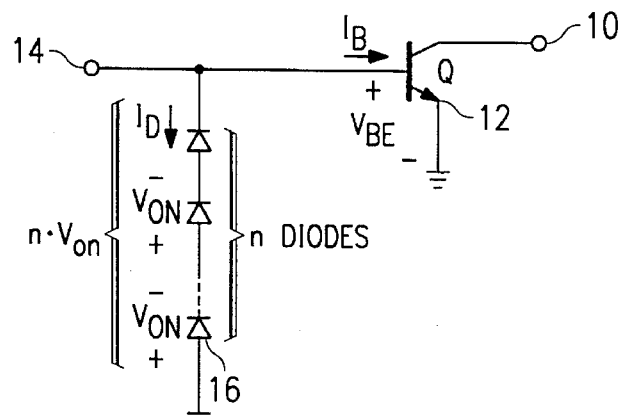
FIG. 3 is a schematic diagram of a first preferred embodiment of the present invention.

FIG. 3 shows a schematic diagram of a first preferred embodiment of the invention. A transistor Q has a collector 10, an emitter 12, and a base 14. A series of one or more diodes 16 are connected between the base 14 and an electrical ground point. If more than one diode 16 is used, the diodes are connected anode-to-cathode, with the free cathode connected to base 14 and the free anode connected to ground. It should be noted that this arrangement is for an npn bipolar transistor. The anodes and cathodes of the diodes could be reversed for a pnp bipolar transistor.

The series of diodes 16 in shunt with the base 14 can prevent transistor Q from going into reverse avalanche breakdown, because the diode series has a turn-on voltage that is slightly lower than the breakdown voltage of the transistor's base-emitter junction. Each of the diodes 16 have a forward bias voltage drop of $V_{ON}$. The diode(s) 16 clamp the reverse biased voltage to a voltage that is the multiple of $-n$ times $V_{ON}$ (where n is the number of diodes 16). This voltage clamping prevents the base-emitter junction of transistor Q from entering the high-noise avalanche breakdown zone ($t_4$ of FIG. 2c). The value of n should be chosen such that ($n \cdot V_{ON}$) is within $V_{ON}$ of the reverse-bias breakdown voltage of the base-emitter junction. Setting the clamping voltage at slightly less than the base-emitter breakdown voltage is important so as to not affect the power performance of the transistor. In normal operation, the diode clamp will only turn on when there is a danger of avalanching. During the positive portion of the RF cycle when the diode(s) 16 are turned off, they present a high impedance to the input RF signal and thus do not disturb the impedance of the transistor. The number of diodes, n, is chosen to satisfy the following equation:

$$n \cdot V_{ON} < V_{BE(BD)} < (n+1) \cdot V_{ON}.$$

In other words, the number of diodes is chosen such that the series of diodes has a turn on voltage that is within a diode turn-on voltage of the avalanche breakdown voltage of the transistor.

Figure 4:
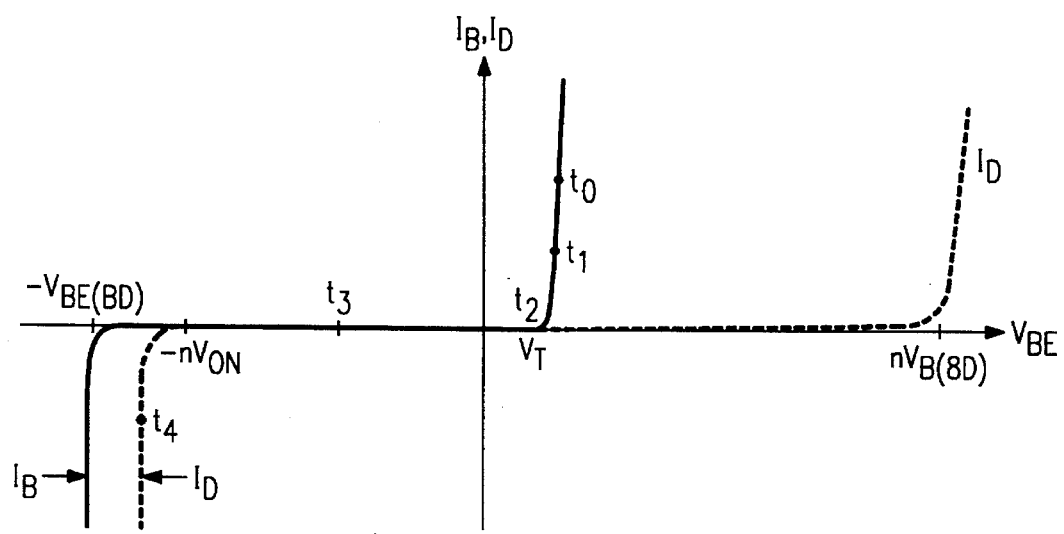
FIG. 4 a graph of the diode current-voltage characteristics superimposed on the current-voltage characteristics of the transistor.

FIG. 4 shows how the diode(s) 16 affect the current-voltage characteristics of the transistor. At $t_4$, instead of being in the noisy avalanche breakdown region of the transistor, the voltage is clamped at $-(n \cdot V_{ON})$, where the noise is from thermionic emission (shot noise) and is therefore several orders of magnitude lower than if the noise were due to avalanching in the base-emitter junction. At $t_0$, $t_1$ and $t_2$, the diode has no effect on the transistor performance because its breakdown voltage ($n \cdot V_{D(BD)}$) is well in excess of the turn-on voltage, $V_T$, of the base-emitter junction of transistor Q.

Figure 5A:
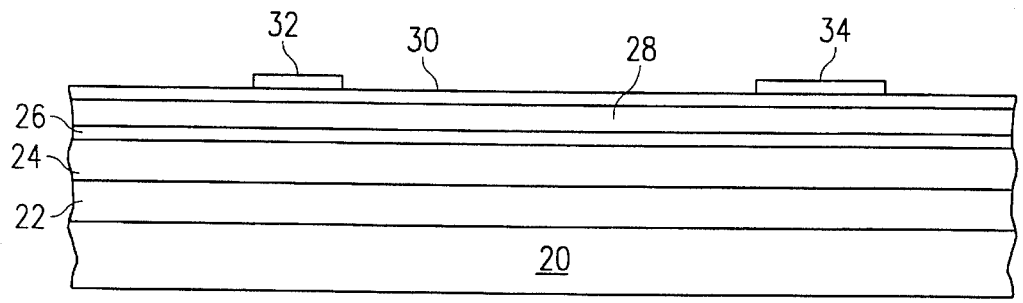
FIGS. 5a–5d are cross-sectional diagrams of various steps in a process for fabricating an embodiment integrated circuit.

An advantage of the invention is that the diodes and transistor may be formed of the same substrate and material structure. FIG. 5a shows the material structure in which a diode and a heterojunction bipolar transistor may be formed. The structure comprises the following: a semi-insulating substrate 20 of a semiconductor such as GaAs; a subcollector layer 22 of n-type GaAs, for example, having a thickness of approximately 1 um and doped with Si, for example, to a concentration of approximately $5 \times 10^{18}$ cm$^{-3}$; a collector layer 24 of n-type GaAs, for example, having a thickness of approximately 1 um and doped at approximately $1 \times 10^{16}$ cm$^{-3}$; a base layer 26 of p-type GaAs, for example, having a thickness of approximately 0.08 um and doped with C, for example, to a concentration of approximately $3 \times 10^{19}$ cm$^{-3}$; an emitter layer 28 of n-type Al$_x$Ga$_{1-x}$As, where x is approximately 0.35, having a thickness of approximately 0.1 um and doped to a concentration of approximately $2 \times 10^{17}$ cm$^{-3}$; and an emitter cap layer 30 of InGaAs, for example, doped at approximately $1 \times 10^{19}$ cm$^{-3}$. On this material structure is formed the emitter contact pattern 32 for the transistor and the cathode contact pattern 34 for the diode. The contact patterns are formed of Ti/Pt/Au for example in thicknesses of approximately 300, 250 and 3000 Angstroms, for example.

The diode performance parameters are most affected by the characteristics of the emitter layer 28 and the size of the cathode contact pattern 34. The doping and mole fraction of Al in the emitter layer 28 can set the turn-on voltage, $V_{ON}$, of the diode (increasing either doping or mole fraction will lower the turn-on voltage), while the reverse breakdown voltage of the base-emitter junction of the transistor, $V_{BE(BD)}$ is largely set by the thickness of the emitter layer 28 (thicker for higher $V_{BE(BD)}$). For the emitter layer characteristics described hereinabove, the $V_{ON}$ is approximately 1.2 Volts and the $V_{BE(BD)}$ is approximately 8 V. Additionally, the dimensions of the diode cathode pattern 34 set the maximum current that the diode can handle without failing. It has been found that a cathode contact pattern of approximately 10 um×10 um is sufficient for the bias current levels of a 1-Watt amplifier.

Figure 5B:
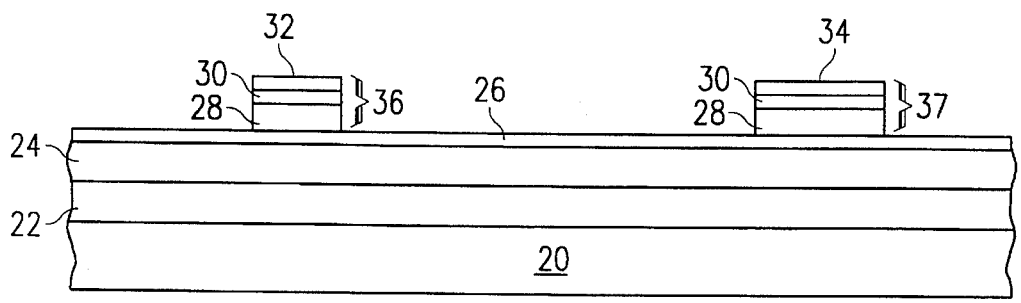
Figure 5C:
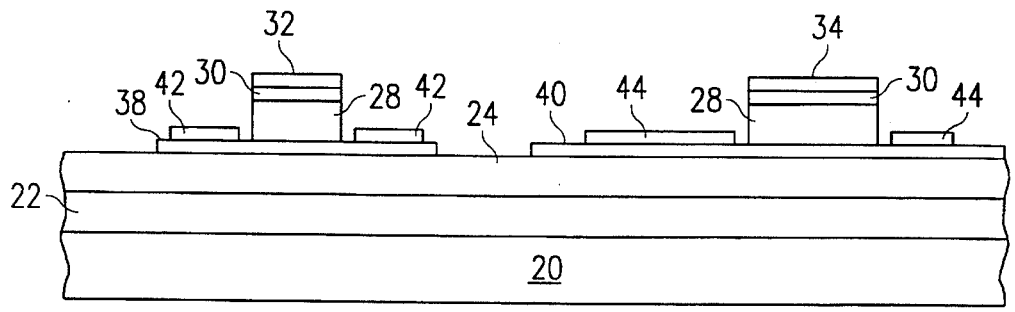
Figure 5D:
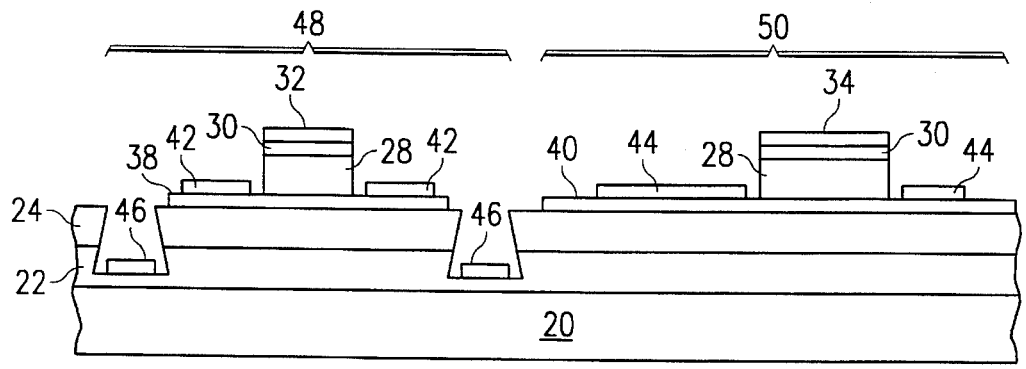

In FIG. 5b, the emitter 28 and emitter contact 30 layers have been removed from the areas of the material not protected by the contact patterns (32 and 34) by using a Reactive Ion Etching technique, for example. This forms the emitter mesa 36 of the transistor and the cathode mesa 37 of the diode. Similarly, in FIG. 5c the base mesa 38 of the transistor and the anode mesa 40 of the diode are formed with another etch step. Base contacts 42 are formed on the base mesa 38 and anode contacts 44 are formed on anode mesa 40. The base contacts are formed of Ti/Pt/Au in thicknesses of approximately 500, 250, and 1500 Angstroms, for example. FIG. 5d shows the integrated transistor 48 and diode 50 after the transistor's collector contacts 46 have been made to the subcollector layer 22. The transistor 48 and diode 50 are generally complete at this point in the process except for interconnecting metallization patterns. It should be noted that the transistor 48 and diode 50 are shown side-by-side in FIGS. 5a–5d only to illustrate process compatibility. The devices will typically be formed at separate locations on a monolithic integrated circuit.

Figure 6A:
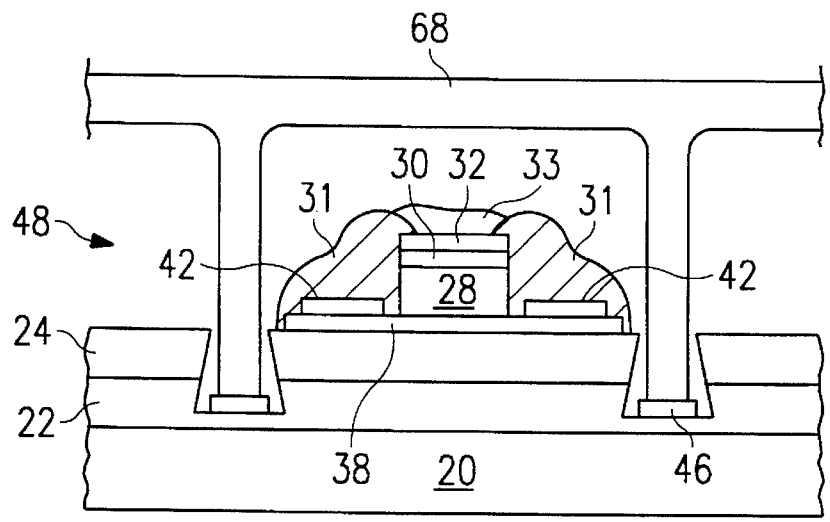
FIG. 6a is a cross-sectional diagram of a heterojunction bipolar transistor.
Figure 6B:
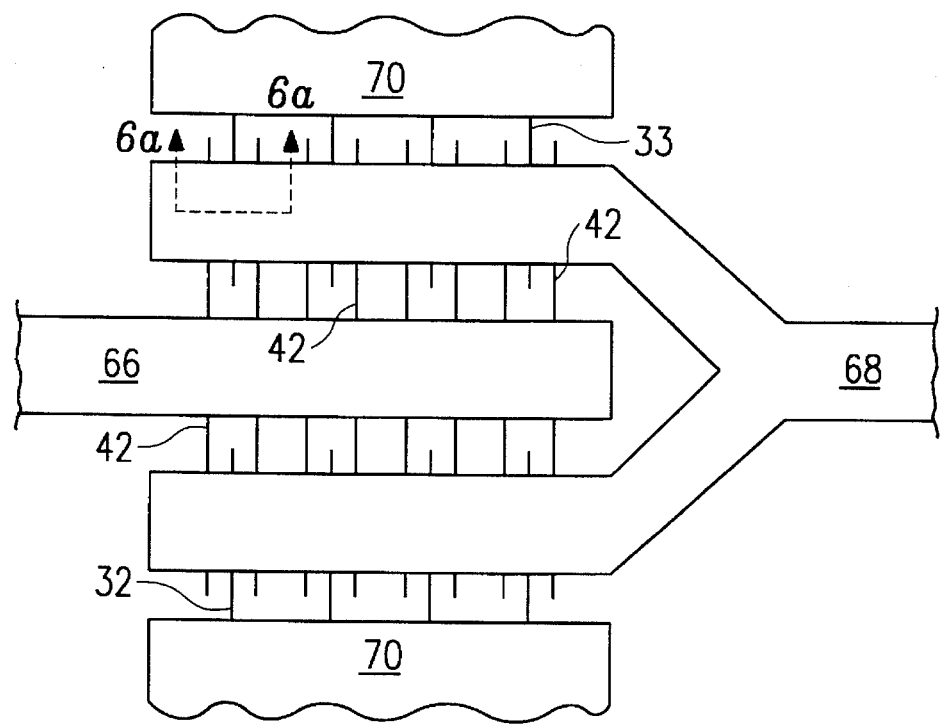
FIG. 6b is a plan view of a microwave heterojunction bipolar transistor layout.

The transistor 48 of FIG. 5d is shown in FIG. 6a with interconnecting metallization patterns for the emitter (33) and the collector (68). A dielectric 31, such as $Si_3N_4$ for example, is typically applied to passivate the device. FIG. 6b is a plan or top view of a typical microwave heterojunction bipolar transistor layout incorporating a plurality of individual transistors 48. In operation a microwave signal enters the transistor along the base transmission line 66 where it branches into a plurality of base fingers 42. A plurality of emitter fingers 33 lead to an emitter pad 70, which in turn is connected to ground in this common-emitter embodiment transistor. The amplified microwave signal exits the transistor along the collector line 68.

A plan view of the diode 50 of FIG. 5d is shown in series with two other diodes in FIG. 7a. FIG. 7b is a schematic representation of the diodes of FIG. 7a, showing the anode-cathode orientation. In FIG. 7a, the cathode 34 and anode 44 contact patterns described in connection with FIGS. 5a–5d are clearly visible. Connecting metal 52, typically plated Au, serves as the connection between the series diodes 50. FIG. 7c is a sectional diagram showing the diode 50 of FIG. 5d with the additional connecting metal 52 and passivating dielectric 31. The diodes are isolated from one another and the surrounding circuitry by ion-implanted isolation regions 54.

Figure 8:
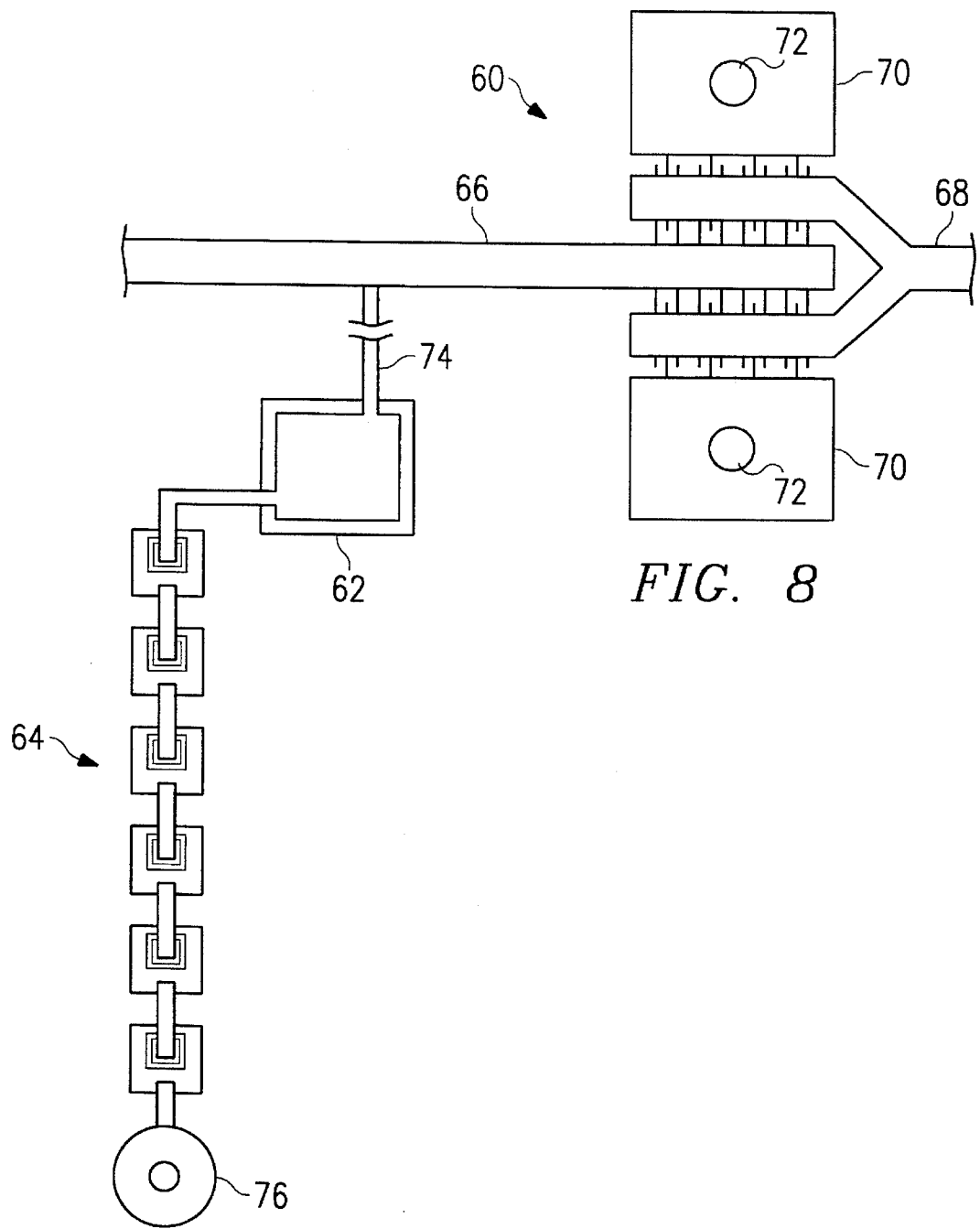
FIG. 8 is a plan view of a layout of an embodiment integrated circuit.

A plan view of a layout of a portion of a monolithic microwave integrated circuit incorporating the invention described herein is shown in FIG. 8. The circuit includes a microwave heterojunction bipolar transistor (indicated generally at 60), a bypass capacitor 62, and a diode string (indicated generally at 64). The transistor 60 comprises a base transmission line 66, a collector transmission line 68, and emitter pads 70 grounded through vias 72 to the backside of the substrate. The transmission line 74 and bypass capacitor 62 create a resonant network that prevents a microwave signal on the base input line 66 from reaching the diode string 64. However, when the microwave signal on base line 66 reaches an amplitude sufficient to create a voltage of approximately 7.2 Volts between the base line and ground, the diode string 64 begins to conduct a DC current sourced from ground-via 76 across the capacitor 62 and along transmission line 74 to the base line 66. This limits the base-emitter junction of the transistor 60 from entering the avalanche breakdown condition by clamping the base-emitter junction at the diode string's voltage drop.

As mentioned hereinabove, a plurality of diodes is typically used to establish the desired clamping voltage. For the embodiment transistor having a $V_{BE(BD)}$ of approximately 8 Volts, six diodes dropping 1.2 V each are used as the clamping circuit (the clamping voltage,$-(n \cdot V_{ON})=-7.2$ Volts in FIG. 4, is within one diode voltage drop of the base-emitter breakdown voltage, $-V_{BE(BD)}=-8$ Volts). In operation, the string of six diodes begins to conduct current when the reverse voltage on the base of the transistor reaches 7.2 Volts. This prevents the avalanche breakdown of the base-emitter junction of the transistor at 8 Volts and thereby avoids generation of the detrimental noise associated with avalanche breakdown. In addition to the noise advantages of the circuit, an amplifier incorporating this transistor and diode configuration is more reliable. This is because the transistor is prevented from catastrophically breaking down, a process that damages the transistor and shortens its lifetime.

An additional advantage of the invention is that it may help in preventing damage from electrostatic discharge (ESD) transients. Heterojunction bipolar transistors (npn) have been shown to be capable of handling a much larger amount of positive voltage in an ESD event than negative voltage. The invention described herein is an ideal solution to this problem in that the clamping diode(s) turn on to divert energy away from the transistor for large negative voltages. This, combined with the transistor's inherent self-protection from large positive voltages, allow for a transistor that is well protected from ESD.

A few preferred embodiments have been described in detail hereinabove. It is to be understood that the scope of the invention also comprehends embodiments different from those described, yet within the scope of the claims.

Internal and external connections can be ohmic, capacitive, inductive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, though the amplifying transistor was described in the embodiments herein as a bipolar transistor in common-emitter (CE) configuration, it may be appreciated that a bipolar transistor in another configuration, such as the common-base (CB) configuration, would benefit from the invention as well. Additionally, the invention applies as well to transistors which incorporate a metal-semiconductor or metal-insulator-semiconductor junction rather than the semiconductor-semiconductor (base-emitter) junction described hereinabove. It is therefore intended that the appended claims encompass any such modifications or embodiments.

What is claimed is:

1. An integrated circuit comprising a transistor and one or more diodes, said transistor and diodes sharing a material structure which includes a base layer adjacent to and lying beneath an emitter layer;

wherein an emitter mesa of said transistor and one or more cathode mesas of said diode comprise said emitter layer;

wherein said circuit includes a base contact and one or more anode contacts on said base layer; and wherein one of said cathode mesas is electrically coupled to said base contact and one of said anode contacts is electrically coupled to electrical ground.

2. The integrated circuit of claim 1 wherein said one or more diodes is at least two diodes, and wherein a cathode mesa of a first diode is coupled to an anode contact of a second diode.

3. The integrated circuit of claim 1 wherein said one or more diodes, when forward-biased, drop a voltage that is less than, but within a single diode voltage drop of, a reverse breakdown voltage of a junction between said emitter mesa and said base layer.

4. The integrated circuit of claim 1 wherein a voltage drop across a forward-biased junction between said cathode mesa and said base layer is approximately 1.2 Volts.

5. The integrated circuit of claim 1 wherein a junction between said emitter mesa and said base layer breaks down at a reverse-bias voltage of approximately 8 Volts.

6. The integrated circuit of claim 1 wherein said emitter layer is n-type AlGaAs and said base layer is p-type GaAs.

7. The integrated circuit of claim 1 wherein said one or more diodes is six diodes.

* * * * *